United States Patent [19]

Szechenyi

[11] 4,156,153
[45] May 22, 1979

[54] ELECTRONIC SWITCH

[75] Inventor: Kalman Szechenyi, Stuttgart, Fed. Rep. of Germany

[73] Assignee: International Standard Electric Corporation, New York, N.Y.

[21] Appl. No.: 836,641

[22] Filed: Sep. 26, 1977

[30] Foreign Application Priority Data

Oct. 1, 1976 [DE] Fed. Rep. of Germany ....... 2644401

[51] Int. Cl.² .................... H03K 17/60; H03K 17/16; H03K 17/30; H04J 3/10
[52] U.S. Cl. ............................. 307/251; 179/18 GF; 307/200 B; 307/241
[58] Field of Search ............... 307/241, 242, 251, 255, 307/352, 353, 200 B; 179/18 GF

[56] References Cited

U.S. PATENT DOCUMENTS

| | | | |
|---|---|---|---|
| 3,313,958 | 4/1967 | Bowers | 307/251 |
| 3,408,511 | 10/1968 | Bergersen | 323/22 R |
| 3,524,996 | 8/1970 | Raper et al. | 307/251 |
| 3,558,921 | 1/1971 | Yokozawa | 307/251 |
| 3,720,848 | 3/1973 | Schmidt, Jr. | 307/251 |
| 3,866,064 | 2/1975 | Gregory | 307/251 |
| 3,872,325 | 3/1975 | Adams et al. | 307/251 |
| 3,969,638 | 7/1976 | Marchetti | 307/251 X |
| 4,001,606 | 1/1976 | Dingwall | 307/251 |

OTHER PUBLICATIONS

Thibodeaux, *Electronics* (pub.); pp. 69–74; 12/25/75.

*Primary Examiner*—Larry N. Anagnos
*Attorney, Agent, or Firm*—John T. O'Halloran; Jeffrey P. Morris

[57] ABSTRACT

An electronic switch comprised of a C-MOS transistor is described. Associated with this transistor is a network consisting of MOS transistors which prevents the C-MOS transistor from being inadvertently turned on as a result of negative input voltages in the absence of bias voltages. When a plurality of C-MOS transistors of the disclosed configuration are utilized as switching elements of a matrix each such matrix is allotted one such network.

6 Claims, 2 Drawing Figures

ELECTRONIC SWITCH

BACKGROUND OF THE INVENTION

The present invention relates to an electronic switch.

The use of electronic switches involves the difficulty that, because of the physical properties of the semiconductor devices used, e.g. C-MOS transistors, inductively or capacitively caused changes in the potential on an input may result in an abnormal switching behaviour of the switch. This is particularly undesirable if a plurality of switches are realized using integrated circuit technology, because other components will be disturbed, too, and if the switches are used as switching elements in switching networks, crosstalk and disturbing noise will occur.

In a C-MOS switch, which consists of the parallel combination of a P-MOS transistor and an N-MOS transistor in a p-well on a common substrate, it is required during normal operation that the input voltage lie in the range between the supply voltages of the two transistors. The bias used for the substrate of the P-MOS transistor is the positive supply voltage, and that for the substrate of the N-MOS transistor is the negative supply voltage, because otherwise the source-substrate junction of one of the transistors would be opened. The switching behaviour of the C-MOS switch becomes abnormal when one or both supply voltages fail, because then the source-substrate junction (s) is (are) no longer protected against being opened.

In addition, the channel of a transistor turns on when the negative (N-MOS) or positive (P-MOS) potential of the input exceeds the transistor's threshold voltage.

The object of the invention is to avoid malfunctions of the switch due to excessive (positive or negative) input voltages and in the absence of the bias voltage(s).

SUMMARY OF THE INVENTION

According to the invention, the object is achieved by a C-MOS switch whose drain and source terminals are connected to first potentials through protective diodes having forward voltages lower than the threshold voltage of the C-MOS switch, and whose substrate terminals are connected to second potentials through a network consisting of a diode between each of the second potentials and the respective substrate terminals and of two series combinations each consisting of a current limiter and a P-MOS transistor and shunted across the diode, with the gate terminals of the transistor connected to the respective second potential, and its drain terminal grounded. This makes it possible to secure the "off" state of the switch even if the supply voltage(s) fails (fail).

The invention will now be explained with reference to the accompany drawing, in which:

DESCRIPTION OF THE PREFERRED EMBODIMENT

Figure 1:
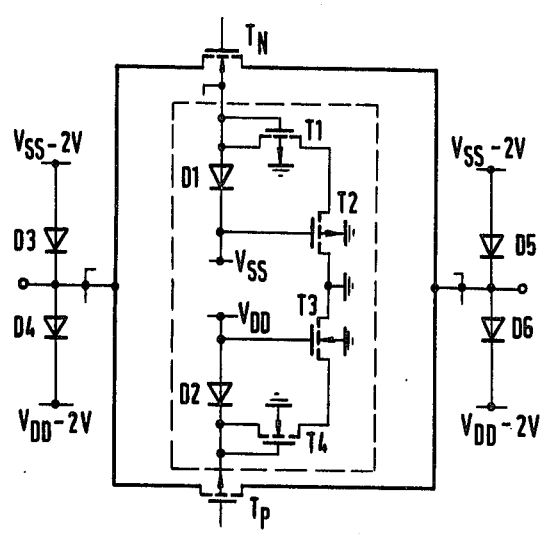
FIG. 1 shows a first embodiment of the invention.

FIG. 1 shows a circuit diagram of a C-MOS switch protected according to the invention, which consists of an N-MOS transistor TN and a P-MOS transistor TP. The input and the output of the C-MOS switch are connected via protective diodes D3, D4 and D5, D6, respectively, to a potential which is, e.g., 2 volts below the respective supply voltage VSS (TN), VDD (TP). The supply voltages VSS and VDD are applied to the substrate terminals of the transistors TN and TP, respectively. This is done by means of a network bordered by broken lines. The protective diodes, whose forward voltages are lower than the threshold voltages of the transistors, provide protection against excessive input voltages. The network affords protection against disturbances in the absence of the supply voltage(s) (opening of the source-substrate junction).

Associated with the transistor TN are P-MOS transistors T1 and T2 as well as a diode D1; analogously, the transistor TP is allotted N-MOS transistors T3 and T4 and an oppositely biased diode D2. The transistors T1 and T4 serve to limit the current.

If the supply voltage VSS fails, for example, the transistor T2 will turn off and the source-substrate junction of the transistor Tn together with the diode D1 will form two back-to-back diodes, so there will be no voltage drop across the souce-substrate junction (VSB≈0) and, consequently, no substrate current can flow; any parasitic coupling between several switches on the same chip is thus impossible.

Figure 2:
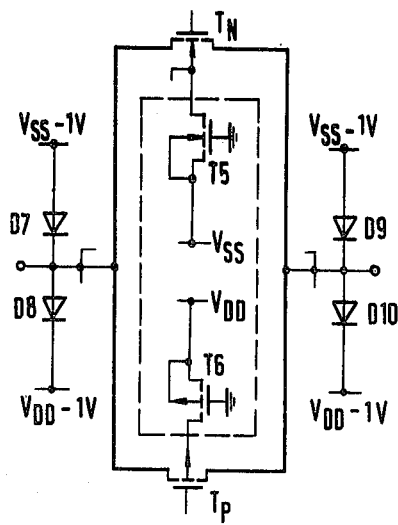
FIG. 2 shows a second embodiment of the invention.

Another embodiment of the network is shown in FIG. 2. The supply voltage VSS is applied to the N-MOS transistor TN through an N-MOS transistor T5, and the supply voltage VDD is applied to the P-MOS transistor TP through a P-MOS transistor T6. If the supply voltage VSS fails, for example, the transistor T5 will turn off. Its source-substrate junction then also forms a diode connected in the same direction as the diode formed by the source-substrate junction of the transistor TN. The voltage drop across the source-substrate junction of the transistor TN is then dependent on the characteristics of the two diodes; if both diodes have the same characteristic, this voltage drop is approximately VD/2. As a result of the exponential dependence of the diode current on the diode voltage, however, a voltage drop of VD/2 only causes a substrate current which has no disturbing effect.

If used in a switching matrix, by way of illustration in a telephone switching system the solutions shown in FIGS. 1 and 2 secure the "off" state against negative input voltages:

- the protective diodes prevent the channel from turning on, and
- the network prevents the generation of a substrate current. If realized using integrated circuit technology, this network can be fabricated on the same chip at a low cost.

The measures according to the invention thus improve the operational reliability of the matrix.

What is claimed is:

1. An electronic switch comprising:
   a C-MOS switch having drain and source terminals connected to first potentials through protective diode means having forward voltages lower than the threshold voltage of said C-MOS switch, and having substrate terminals connected to second potentials through a network comprising a diode between each of said second potentials and said substrate terminals, and a series combination comprising a current limiter and an MOS transistor shunted across each said diode, said MOS transistors having their gate terminals connected to a respective second potential and having a common ground.

2. The electronic switch as set forth in claim 1 wherein said MOS transistors comprise a P-MOS transistor and an N-MOS transistor.

3. An electronic switch comprising:
a C-MOS switch having drain and source terminals connected to first potentials through protective diode means having forward voltages lower than the threshold voltage of said C-MOS switch, and having substrate terminals connected to second potentials through a network comprising one of N-MOS transistor means and one of P-MOS transistor means having channels connected between a respective second potential and the associated substrate terminals, and having substrates connected to said respective second potential.

4. In a telephone switching system an integrated matrix including a plurality of switching elements with each matrix having one network assigned thereto an electronic switch comprising:
a C-MOS switch having drain and source terminals connected to first potentials through protective diode means having forward voltages lower than the threshold voltage of said C-MOS switch, and having substrate terminals connected to second potentials through a network comprising a diode between each of said second potentials and said substrate terminals, and a series combination comprising a current limiter and an MOS transistor shunted across each said diode, said MOS transistors having their gate terminals connected to a respective second potential and having a common ground.

5. The electronic switch as set forth in claim 4 wherein said MOS transistors comprise a P-MOS transistor and an N-MOS transistor.

6. In a telephone switching system an integrated matrix including a plurality of switching elements with each matrix having one network assigned thereto an electronic switch comprising:
a C-MOS switch having drain and source terminals connected to first potentials through protective diode means having forward voltages lower than the threshold voltage of said C-MOS switch, and having substrate terminals connected to second potentials through a network comprising one of N-MOS transistor means and one of P-MOS transistor means having channels connected between a respective second potential and the associated substrate terminals, and having substrates connected to said respective second potential.

* * * * *